US006822278B1

United States Patent
Koutny

(10) Patent No.: US 6,822,278 B1
(45) Date of Patent: Nov. 23, 2004

(54) LOCALIZED FIELD-INDUCDING LINE AND METHOD FOR MAKING THE SAME

(75) Inventor: William W.C. Koutny, Santa Clara, CA (US)

(73) Assignee: Silicon Magnetic Systems, San Jose, CA (US)

( * ) Notice: Subject to any disclaimer, the term of this patent is extended or adjusted under 35 U.S.C. 154(b) by 0 days.

(21) Appl. No.: 10/241,040

(22) Filed: Sep. 11, 2002

(51) Int. Cl.[7] .............................................. H01L 21/00
(52) U.S. Cl. ........................ 257/295; 257/421; 257/659; 257/775; 365/158; 365/171; 365/173
(58) Field of Search .................................. 257/295, 421, 257/659, 775, 422, 762; 365/158, 171, 173

(56) References Cited

U.S. PATENT DOCUMENTS

| | | | | |
|---|---|---|---|---|
| 5,946,227 A | * | 8/1999 | Naji ............................ | 365/158 |
| 6,165,803 A | | 12/2000 | Chen et al. | |
| 6,498,747 B1 | * | 12/2002 | Gogl et al. ................ | 365/158 |
| 6,555,858 B1 | * | 4/2003 | Jones et al. ................ | 257/295 |
| 6,597,049 B1 | * | 7/2003 | Bhattacharyya et al. .... | 257/421 |

* cited by examiner

*Primary Examiner*—David Nelms
*Assistant Examiner*—Dao H. Nguyen
(74) *Attorney, Agent, or Firm*—Kevin L. Daffer; Mollie E. Lettang

(57) ABSTRACT

A magnetic random access memory (MRAM) device is provided which includes a field-inducing line with a first layer having a plurality of dielectrically spaced conductive segments and a second layer having a conductive portion in contact with at least two of the dielectrically spaced conductive segments. A method for fabricating such a field-inducing layer may include patterning a conductive layer to form the first layer and depositing another conductive layer above at least a portion of the first layer to form the second layer. In some cases, a surface of a first lateral portion of the field-inducing line substantially aligned with a magnetic junction of the device may include a cladding layer, while a surface of a second portion of the field-inducing line substantially aligned with a spacing arranged adjacent to the magnetic junction may be substantially absent of a cladding layer.

20 Claims, 3 Drawing Sheets

LOCALIZED FIELD-INDUCDING LINE AND METHOD FOR MAKING THE SAME

BACKGROUND OF THE INVENTION

1. Field of the Invention

This invention relates to magnetic memory devices, and more particularly, to field-inducing line configurations arranged adjacent to magnetic cell junctions.

2. Description of the Related Art

The following descriptions and examples are given as background information only.

Recently, advancements in the use of magneto-resistive materials have progressed the development of magnetic random access memory (MRAM) devices to function as viable non-volatile memory circuits. In general, MRAM circuits exploit the electromagnetic properties of magneto-resistive materials to set and maintain information stored within individual magnetic memory cell junctions of the circuit. In particular, MRAM circuits utilize magnetization direction to store information within a memory cell junction, and differential resistance measurements to read information from the memory cell junction. Typically, an MRAM device includes a plurality of conductive lines with which to generate magnetic fields such that the magnetic direction of one or more memory cell junctions may be changed or oriented. Consequently, the conductive lines may also be referred to as "field-inducing lines." In some cases, the conductive lines may be referred to as "bit" and "digit" lines. Generally, "bit" lines may refer to conductive lines arranged in contact with memory cell junctions that are used for both write and read operations of the memory cell junctions. "Digit" lines, on the other hand, may refer to conductive lines spaced adjacent to the memory cell junctions that are used primarily during write operations of the memory cell junctions.

Typically, bit lines and digit lines are formed as substantially straight and contiguous structures of metal having uniform widths. In most cases, it is desirable to fabricate a field-inducing line with a relatively low amount of resistivity. As such, bit lines and digit lines typically include a single bulk material such as, aluminum or copper, for example. In some cases, the conductive lines may further include a magnetic cladding layer, such as nickel-iron or cobalt-iron, to concentrate a magnetic field in a particular direction. In general, a "cladding layer," as used herein, may refer to a metal sheathe used to cover or line a portion of a metal structure. Typically, the placement of a cladding layer within a field-inducing line of a magnetic memory cell device may be along the surfaces of the bit lines and/or digit lines farthest away from the magnetic cell junctions of the device. For example, in an embodiment in which a conductive line is arranged above a memory cell junction, a cladding layer may comprise the sidewalls and upper surface of the conductive line. However, in an embodiment in which a conductive line is alternatively or additionally arranged below the memory cell junction, a cladding layer included within such a lower conductive line may comprise the sidewalls and lower surface of the conductive line. In this manner, the magnetic cladding layer included within the bit and/or digit lines of a magnetic memory cell device may advantageously focus a generated magnetic field toward a memory cell junction. As a result, the magnetic direction of the memory cell junction may be more easily oriented.

Unfortunately, in some cases, the combination of an aluminum structure with a cladding layer may prove to be difficult to fabricate. In particular, forming a reliable device with an aluminum field-inducing line having a cladding layer below a memory cell junction is generally very difficult. Typically, an aluminum line is patterned rather than formed by the dual damascene technique. In general, the "dual damascene technique" may refer to a method in which a structure is formed by filling a trench with a material and polishing the material to be coplanar with the upper surface of the trench. Such a fill and polish technique is generally undesirable for fabricating an aluminum structure, since polishing aluminum is difficult and produces many fabrication issues. In particular, aluminum tends to oxidize easily and aluminum oxide is typically difficult to remove during a polishing process. In addition, even in an embodiment in which aluminum oxide can be removed during a polishing process, the underlying aluminum material is generally softer than aluminum oxide. Consequently, in such an embodiment, the polishing process tends to create several other fabrication problems, including but not limited to scratches, dishing, and surface roughness. As such, aluminum lines are generally formed using a patterning process. Such a patterning process, however does not allow a cladding layer to be formed along the bottom and sidewalls of a structure. Therefore, forming a reliable device with an aluminum field-inducing line having a cladding layer below a memory cell junction is generally improbable.

Copper, on the other hand, may be feasibly fabricated using a dual damascene process and therefore, may be fabricated with a cladding layer. However, the use of copper creates a variety of fabrication concerns, including safety hazards, reliability issues, and the possibility of rendering fabrication equipment and/or devices unusable. In particular, copper has a high solubility with silicon and therefore, can readily change the properties of silicon and its function within a device. Such a change in properties can cause a device to malfunction, rendering the device unusable or at least having reduced reliability. The infusion of copper with silicon may originate through the diffusion of ions within structures and layers of the device during or subsequent to the fabrication process of the device. In addition or alternatively, copper and silicon infusion may occur through contamination of the fabrication equipment. Consequently, fabrication equipment contaminated with copper may need to be cleaned and purged before any further fabrication may be conducted to prevent occurrences of infusing copper with silicon. Such a clean-up process can be extensive, requiring large amounts of time and money. As such, in some embodiments, it may be desirable to limit the amount of copper used in the fabrication of semiconductor devices.

Accordingly, it may be advantageous to develop an MRAM device with a different field-inducing line configuration than used in conventional devices. In particular, it may be advantageous to develop a field-inducing line configuration having relatively low resistivity and, in some embodiments, a cladding layer included therein. In addition, it may be advantageous to develop a field-inducing line configuration that is substantially absent of copper.

SUMMARY OF THE INVENTION

The problems outlined above may be in large part addressed by a magnetic random access memory (MRAM) device having a different field-inducing line configuration than used in conventional devices. In some cases, the field-inducing line may include a first layer with a plurality of dielectrically spaced conductive segments. In addition, the field-inducing line may include a second layer with a conductive portion in contact with at least two of the plurality of the dielectrically spaced conductive segments of the first layer. In some embodiments, the conductive portion of the second layer may span across and in contact with all of the dielectrically spaced conductive segments of the first layer. Alternatively, the conductive portion of the second layer may be one of a plurality of dielectrically spaced conductive portions arranged in contact with the plurality of conductive segments of the first layer. In such an embodiment, the plurality of conductive segments of the first layer and the plurality of conductive portions of the second layer may be, in some cases, alternately arranged within the field-inducing line. In other cases, the plurality of conductive segments of the first layer and the plurality of conductive portions of the second layer may be arranged in a different manner.

In any embodiment, the second layer may be arranged vertically closer to magnetic junctions of the device than the first layer is arranged to the magnetic junctions. In addition, the second layer may be formed above or below the first layer. In this manner, the field-inducing line may be arranged above or below a magnetic cell junction of the topography. In some cases, a magnetic junction of the topography may be arranged vertically adjacent to the conductive portion of the second layer. Consequently, a device is provided which includes a conductive line with a first lateral portion vertically aligned with a magnetic junction. In some cases, a surface of such a first lateral portion arranged farthest from the magnetic cell junction may include a cladding layer. Alternatively, the surface of the first lateral portion arranged farthest from the magnetic cell junction may be absent of a cladding layer. In some cases, the first lateral portion may include a cladding layer upon a sidewall surface of the first lateral portion. For example, the first lateral portion may include a cladding layer upon all sidewall surfaces of the first lateral portion, in some embodiments. In other cases, however, the first lateral portion may include a cladding layer upon less than all of the sidewall surfaces of the first lateral portion. In either case, the conductive portion of the second layer of the field-inducing line, as described above, may include a cladding layer outlining either the upper or lower surface along with the sidewalls of the conductive portion.

In contrast, the first layer of the field-inducing line may be substantially absent of a cladding layer. As stated above, the first layer of the field-inducing line may include dielectrically spaced conductive segments. In some embodiments, such dielectrically spaced conductive segments may be arranged in substantial alignment with regions of the device laterally adjacent to magnetic cell junctions of the device. As such, a device is provided which includes a conductive line having a second lateral portion aligned with a region of the device arranged between two magnetic junctions. In some embodiments, the conductive portion of the second layer of the field-inducing line may be arranged vertically adjacent to the dielectrically spaced conductive segments of the first layer of the field-inducing line and, therefore, may comprise a part of the second lateral portion. Alternatively, the conductive portion of the second layer of the field-inducing line may not be arranged vertically adjacent to the conductive segments of the first layer and, therefore, may not be part of the second lateral portion. Consequently, the second lateral portion may or may not include a cladding layer. However, in any embodiment, the surface of the second lateral portion arranged farthest from the region of the device arranged between two magnetic junctions may preferably be absent of a cladding layer, since the first layer of the field-inducing line comprises such a second lateral portion and is preferably absent of a cladding layer.

In some embodiments, the field-inducing line may be adapted to induce a higher magnetic field along a magnetic junction than along a region of the device arranged laterally between magnetic junctions. For example, in some embodiments, the first lateral portion of the field-inducing line may be arranged vertically closer to a magnetic junction of the device than the second lateral portion of the field-inducing line is vertically arranged to a region of the device between the magnetic junction and an adjacent magnetic junction. In addition or alternatively, the first lateral portion may be adapted to conduct a higher density of current than the second lateral portion. In such an embodiment, at least one of the conductive segments of the first layer of the field-inducing line may be thicker than the conductive portion of the second layer in some embodiments. In yet other cases, the thickness of one or more of the conductive segments of the first layer may be less than or substantially similar to the thickness of the conductive portion of the second layer.

In general, the dielectrically spaced conductive segments of the first layer and the conductive portion of the second layer may include any metal material. In some embodiments, the conductive segments of the first layer and the conductive portion of the second layer may include the same material. In other embodiments, however, the conductive segments of the first layer and the conductive portion of the second layer may include different materials. For example, in some embodiments, the dielectrically spaced conductive segments of the first layer may include aluminum while the conductive portion of the second layer may include tungsten. Consequently, in some embodiments, the first lateral portion of the conductive line substantially aligned with an overlying magnetic junction may include a different material than the second lateral portion of the conductive line substantially aligned with a spacing arranged adjacent to the magnetic junction. In some embodiments, the second layer may include a material having lower resistivity than a material included in the first layer. In this manner, the second lateral portion of the field-inducing line may include a material having lower resistivity than a material included in the first lateral portion of the field-inducing line. For example, the second lateral portion may include aluminum, while the first lateral portion may include tungsten. In some cases, the second lateral portion of the field-inducing line may further include at least one of the same materials as the first lateral portion of the field-inducing line. For instance, in the aforementioned example, the second lateral portion may further include tungsten, in some cases.

A method for fabricating a magnetic random access memory device is also contemplated herein. In particular, the method may include patterning a first conductive layer to form a lower portion of a field-inducing line and depositing a second conductive layer upon and in contact with at least a part of the lower portion to form an upper portion of the field-inducing line. Subsequently, the method may include forming one or more magnetic junctions in alignment with the upper portion of the field-inducing line. In some cases, the method may include polishing the second conductive layer prior to forming the one or more magnetic junctions. In addition or alternatively, the method may include depositing a dielectric layer above the lower portion of the field-inducing line and etching one or more trenches within the dielectric layer to expose at least a part of the lower portion prior to depositing the second conductive layer. Such a method may further include depositing a cladding layer within the one or more trenches prior to the step of depositing the second conductive layer. In yet other embodiments, the method may not include forming a cladding layer within the one or more trenches. In either case, the step of patterning the first conductive layer may include forming a plurality of separated conductive segments. In such an embodiment, the step of etching the one or more trenches may include etching a plurality of trenches spaced apart from each other and spanned above the plurality of separated conductive segments.

There may be several advantages to forming a magnetic memory device as described herein. In particular, the method described herein may provide a manner in which to form a field-inducing line with a cladding layer below a magnetic junction without having to contend with the fabrication issues related to copper infusion into silicon. In addition, the configuration of the field-inducing line described herein may, in some embodiments, allow a cladding layer to be formed on five walls (i.e., the bottom and four sidewall surfaces) of a portion of the field-inducing line rather than along three walls (i.e., the bottom and two sidewall surfaces) as compared to conventional field-inducing lines. Moreover, the field-inducing line described herein may be configured to allow a magnetic field to be concentrated along an overlying magnetic junction to more easily orient the magnetic direction of the junction. More specifically, the field-inducing line may be configured to have a higher density of current directly below the magnetic junction than in conventional devices, in some embodiments. In this manner, lower amounts of current may be used to orient the magnetic directions of magnetic junctions than in conventional devices, thereby lowering the overall power requirements of the device described herein. Furthermore, the structure described herein may offer a smooth surface with low resistance. In some embodiments, the field-inducing line described herein may be further used to modulate the temperature of the magnetic cell junction by using the portion of the field-inducing line directly below the magnetic cell junction as a heating element.

BRIEF DESCRIPTION OF THE DRAWINGS

Other objects and advantages of the invention will become apparent upon reading the following detailed description and upon reference to the accompanying drawings in which.

Figure 1:
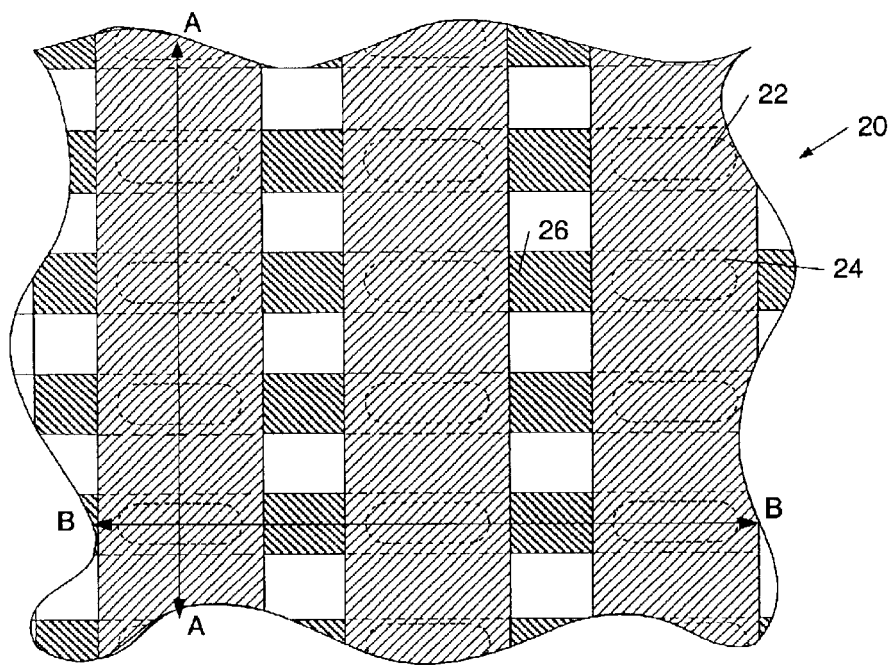
FIG. 1 depicts a partial top view of a magnetic random access memory device comprising a plurality of bit and digit lines.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, FIGS. 1-5 illustrate exemplary embodiments of a magnetic random access memory (MRAM) device having a field-inducing line with at least two distinct layers. In addition, FIGS. 1-5 show exemplary embodiments of dual layer field-inducing lines having a plurality of lateral portions with different material and pattern configurations. FIG. 1 illustrates a partial top view of device 20 having a plurality of magnetic junctions 22 interposed between bit lines 24 and digit lines 26. In general, bit lines 24 may overly magnetic junctions 22 and respective underlying portions of digit lines 26. As such, magnetic junctions 22 and respective underlying portions of digit lines 26 are represented by dashed lines in FIG. 1, indicating that they are arranged below the bit lines. Accordingly, portions of digit lines 26 not covered by bit lines 24 are not outlined by dashed lines in FIG. 1. In an alternative embodiment, bit lines 24 may be arranged below magnetic junctions 22 and digit lines 26 may be arranged above bit lines 24. In such an embodiment, the vertical position of bit lines 24 and digit lines 26 relative to magnetic junctions 22 may be reversed. In yet another embodiment, an MRAM device may only employ a single field-inducing line with which to switch the magnetic direction of a magnetic junction.

Figure 2:
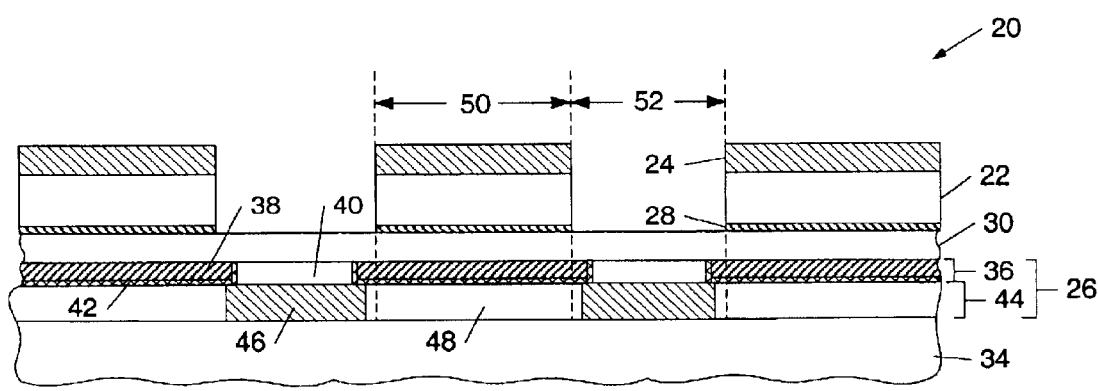
FIG. 2 depicts a partial cross-sectional view of the device in FIG. 1 taken along one of the digit lines, wherein the digit line includes a multi-layer configuration.
Figure 3:
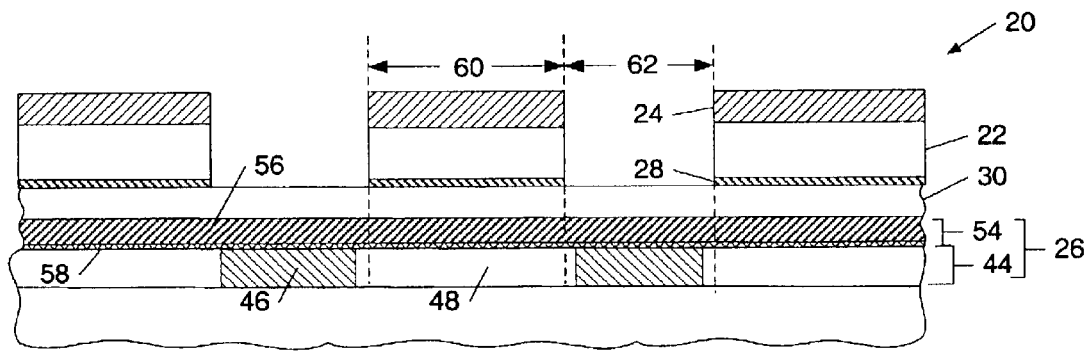
FIG. 3 depicts a partial cross-sectional view of the device in FIG. 1 taken along one of the digit lines, in an alternative embodiment, wherein the digit line includes a multi-layer configuration.
Figure 4:
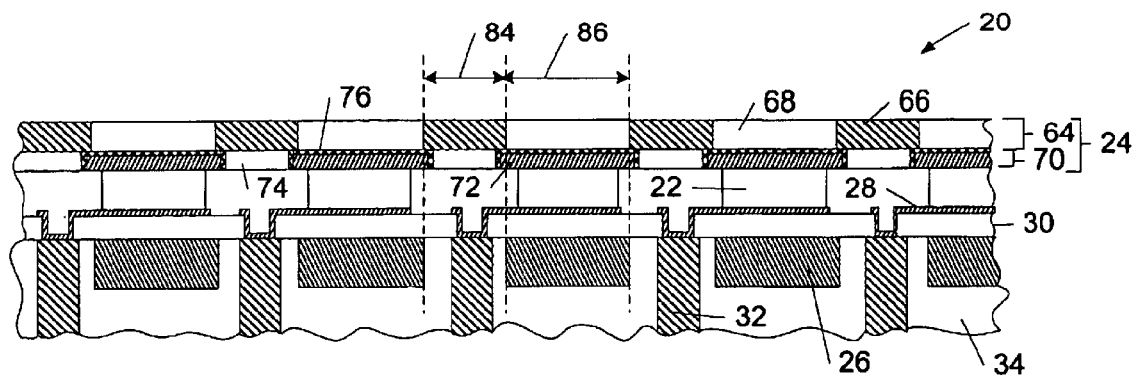
FIG. 4 depicts a partial cross-sectional view of the device in FIG. 1 taken along one of the bit lines, wherein the bit line includes a multi-layer configuration.
Figure 5:
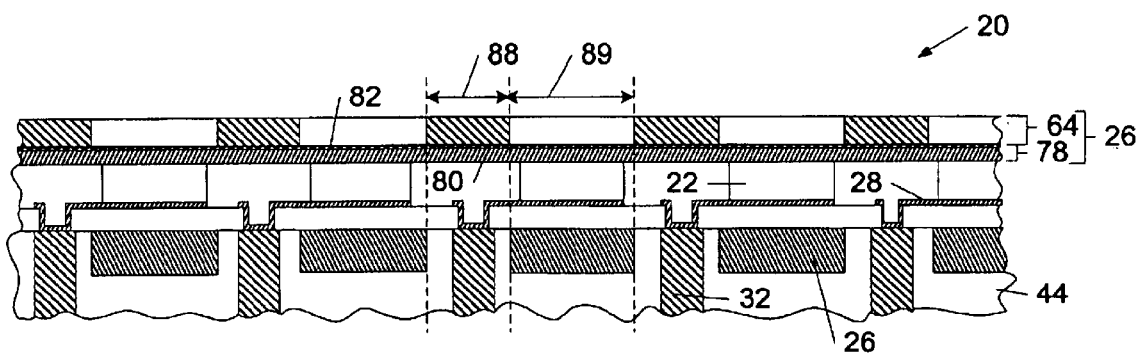
FIG. 5 depicts a partial cross-sectional view of the device in FIG. 1 taken along one of the bit lines, in an alternative embodiment, wherein the bit line includes a multi-layer configuration.

FIGS. 2-5 illustrate different exemplary embodiments of layer and pattern configurations for bit lines 24 and digit lines 26. In particular, FIGS. 2 and 3 illustrate different exemplary embodiments of one of digit lines 26 taken along line BB of FIG. 1. Whereas, FIGS. 4 and 5 illustrate different exemplary embodiments of one of bit lines 24 taken along line AA of FIG. 1. Consequently, the cross-sectional views of bit lines 24 and digit lines 26 in FIGS. 2-5 may not correspond to the top view of device 20 in FIG. 1. In particular, the striped patterns distinguishing bit lines 24 and digit lines 26 in FIG. 1 may not correspond to the striped patterns used to distinguish the one or more layers of bit lines 24 and digit lines 26 in FIGS. 2-5. In addition, although the configurations of field-inducing lines described herein are in reference to the arrangement of bit lines 24 and digit lines 26 in FIG. 1, the configurations are not restricted to such an arrangement. In particular, the field-inducing line configurations described herein may be applied to any magnetic field-inducing line arranged within a topography including a magnetic cell junction, including those which have digit lines arranged above bit lines or those which include only one field-inducing line.

In any embodiment, device 20 may include other structures and/or layers arranged above, below, and/or in-between bit lines 24 and digit lines 26. Some of such layers and structures are shown in FIGS. 2-5, but are not shown in FIG. 1 to simplify the illustration of FIG. 1. For example, device 20 may include electrodes 28 arranged below magnetic junctions 22 and spaced above digit lines 26. In particular, electrodes 28 may be arranged upon dielectric layer 30 and coupled to contact structures 32. In this manner, dielectric layer 30 may be used to isolate digit lines 26 from electrodes 28. In addition, device 20 may include dielectric 34 to isolate digit lines 26 from contact structures 32. In some cases, device 20 may include other structures and/or layers not shown in FIGS. 1-5. For example, device 20 may include gate structures, vias, interconnect lines, and other interlevel dielectrics and contacts arranged either above or below the topography shown in FIGS. 1-5.

Moreover, device 20 may continue beyond the peripheries of the topography shown in FIGS. 1-5. In this manner, device 20 may include additional structures and layers arranged adjacent to the layers and structures shown in FIGS. 1-5. In some embodiments, such additional structures and layers may be substantially similar to the respective layers and structures illustrated in FIGS. 1-5. Furthermore, FIG. 1 shows magnetic cell junctions 22 in an elliptical shape. However, the layout, pattern, and/or structure configuration of bit lines 24 and digit lines 26 as described herein may be included with magnetic cell junctions of any shape. It is noted that the shapes of magnetic cell junctions 22 shown in FIG. 1 are merely shown as an exemplary embodiment and the configurations of field-inducing lines as described herein are not limited to devices including magnetic cell junctions with such a shape.

As will be explained in more detail below in reference to FIGS. 2-5, bit lines 24 and/or digit lines 26 may include different layers of metal having distinct pattern configurations. For example, bit lines 24 and/or digit lines 26 may include a first layer having a plurality of dielectrically spaced conductive segments and a second layer having a conductive portion in contact with at least two of the plurality of the dielectrically spaced conductive segments of the first layer. In this manner, the first and second layers may comprise a continuous conductive line. In some embodiments, the first and second layer may include similar metal compositions. In particular, the first and second layers may include one or more of the same materials. Alternatively and as explained in more detail below, however, the first layer and second layer may preferably include different metals and/or alloys. In this manner, bit lines 24 and/or digit lines 26 may include at least two different layers of metal, in some embodiments. In some embodiments, the first layer may include a material with lower resistivity than a material of the second layer. For example, in some embodiments, the first layer may include aluminum and the second layer may include tungsten. In general, however, bit lines 24 and digit lines 26 may be adapted to conduct current and, therefore, may be made of any conductive material, such as aluminum, copper, titanium, tungsten, or any alloy of such metals. In addition, other materials may be used for the first and second layers of bit lines 24 and/or digit lines 26, depending on the design characteristics of the device.

In any embodiment, the second layer may be arranged vertically closer to magnetic junctions 22 than the first layer is arranged to magnetic junctions 22. In addition, the second layer may be formed above or below the first layer. In this manner, a field-inducing line including a dual layer configuration may be arranged above or below magnetic cell junctions 22 and, as such, may be applied to either bit lines 24 or digit lines 26. In some cases, one of magnetic junctions 22 may be arranged vertically adjacent to the conductive portion of the second layer of the field-inducing line. Consequently, bit lines 24 and/or digit lines 26 may include a first lateral portion vertically aligned with one of magnetic junctions 22 that comprises at least a portion of the second layer. In contrast, the dielectrically spaced conductive segments of the first layer may be arranged in substantial alignment with regions of the device laterally adjacent to the magnetic cell junctions of the device. As such, bit lines 24 and/or digit lines 26 may include a second lateral portion vertically aligned with a region of device 22 arranged between two of magnetic junctions 22. In some embodiments, the conductive portion of the second layer of the field-inducing line may be arranged vertically adjacent to the dielectrically spaced conductive segments of the first layer and, therefore, may comprise a part of the second lateral portion. Alternatively, the conductive portion of the second layer may not be arranged vertically adjacent to the conductive segments of the first layer and, therefore, may not be part of the second lateral portion. Likewise, the conductive segments of the first layer may not be a part of the first lateral portion of bit lines 24 and/or digit lines 26 in some cases. In an alternative embodiment, however, a portion of the conductive segments of the first layer may be part of the first lateral portion.

In some cases, bit lines 24 and/or digit lines 26 may further include a cladding layer interposed between the first layer and the second layer. More specifically, the conductive portion of the second layer may include a cladding layer along a surface of the second layer that is farthest from an adjacent magnetic junction. Consequently, in some embodiments, the first lateral portion of bit lines 24 and/or digit lines 26 may include a cladding layer along a surface of the first lateral portion that is arranged farthest from the magnetic junction. In some cases, the first lateral portion may further include the cladding layer upon a sidewall surface of the first lateral portion. For example, the first lateral portion may include the cladding layer upon all sidewall surfaces of the first lateral portion, in some embodiments. In other cases, however, the first lateral portion may include the cladding layer upon less than all of the sidewall surfaces of the first lateral portion. Alternatively, the surface of the first lateral portion arranged farthest from the magnetic cell junction may be absent of a cladding layer. In contrast to embodiments in which the second layer includes a cladding layer, the first layer of bit lines 24 and/or digit lines 26 may be substantially absent of a cladding layer in some cases. In other words, in embodiments in which the second layer comprises a cladding layer, the first layer may or may not include a cladding layer. As such, in some embodiments, a surface of the second lateral portion of bit lines 24 and/or digit lines 26 farthest away from an adjacent region of the topography arranged between two magnetic junctions may be substantially absent of a cladding layer, while the surface of the first lateral portion of bit lines 24 and/or digit lines 26 farthest away from an adjacent magnetic junction may include a cladding layer.

Embodiments illustrating configurations of such first and second layers and lateral portions of bit lines 24 and/or digit lines 26 are shown in FIGS. 2-5. In particular, FIG. 2 depicts one of digit lines 26 having first layer 44, second layer 36, and lateral portions 50 and 52. In contrast, FIG. 3 illustrates a different pattern configuration for one of digit lines 26 that includes first layer 44, second layer 54, and lateral portions 60 and 62. FIGS. 4 and 5, on the other hand, depict exemplary embodiments of one of bit lines 24 having first layers 64 and second layers 70 and 78, respectively. FIGS. 2 and 3 illustrate a partial cross-sectional view of device 20 along line BB of FIG. 1; while FIGS. 4 and 5 depict a partial cross-sectional view of device 20 along line AA of FIG. 1. It is noted that, although the layers of bit lines 24 and digit lines 26 in FIGS. 2-5 may include dielectric portions interposed between conductive portions of the field-inducing line, such dielectric portions are not considered part of the field-inducing line since such portions are not configured to induce a magnetic field. As such, the reference of first and second layers and lateral portions may generally refer to the conductive portions of the layers and lateral portions of bit lines 24 and digit lines 26.

As shown in FIG. 2, first layer 44 may include conductive segments 46 spaced from each other by dielectric portions 48. In addition, second layer 36 may include conductive portions 38 spaced from each other by dielectric portions 40. As shown in FIG. 2, conductive portions 38 may be arranged in contact with at least two of conductive segments 46 of first layer 44. Consequently, conductive portions 38 may be arranged above dielectric portions 48. In addition, portions of conductive portions 38 may laterally overlap portions of conductive segments 46 such that the digit line depicted in FIG. 2 may conduct current along the entire line. Such an overlap may include a lateral dimension between approximately 0.1 micron and approximately 1.0 micron, in some embodiments. Larger or smaller lateral dimensional values of the overlap between conductive portions 38 and conductive segments 46, however, may be appropriate, depending on the design specifications of the device.

As illustrated in FIG. 2, conductive portions 38 may be arranged in substantial alignment with magnetic junctions 22, while conductive segments 48 may be substantially aligned with regions of device 20 interposed between two of magnetic junctions 22. In this manner, first lateral portion 50 of the digit line may be aligned with at least part of one of conductive portions 38. In addition, second lateral portion 52 may be aligned with one of conductive segments 46. Consequently, the digit line depicted in FIG. 2 may include an alternating arrangement of conductive portions 38 and conductive segments 46. Other arrangements of conductive portions 38 and conductive segments 46, however, may be appropriate, depending on the design characteristics of the device. For example, in some embodiments, the second layer of the digit line may include a conductive portion that spans across and in contact with all of dielectrically spaced conductive segments 46 of first layer 44. Such an embodiment is illustrated in FIG. 3.

As stated above, FIG. 3 illustrates an alternative embodiment for one of digit lines 26 that includes first layer 44 and second layer 54. Similar to FIG. 2, first layer 44 may include conductive segments 46 spaced from each other by dielectric portions 48. In contrast, however, second layer 54 may include conductive portion 56 spanned across and in contact with all of conductive segments 46. Consequently, FIG. 3 illustrates lateral portion 62 aligned with a region of device 20 arranged between two of magnetic junctions 22 including a part of conductive portion 56 and one of conductive segments 46. In addition, FIG. 3 illustrates lateral portion 60 substantially aligned with one of magnetic junctions 22 including a different part of conductive portion 56 spaced above one of dielectric portions 48.

In either embodiment, second layers 36 and 54 may be arranged vertically closer to magnetic junctions 22 than first layer 44 is vertically arranged to the regions of device 20 between magnetic junctions 22. Consequently, the magnetic field induced by first lateral portions 50 and 60 may be closer to magnetic cell junctions 22 than the magnetic field induced by second lateral portions 52 and 62 is to the regions of device 20 in between magnetic cell junctions 22. As a result, magnetic junction 22 may be subjected to a higher magnetic field than the region of device 20 arranged laterally adjacent to (i.e., between) magnetic junctions 22. Such a phenomenon may be realized by the configuration of lateral portion 52 to have dielectric portions 40 arranged above conductive segments 46 and lateral portion 62 to have portions of both conductive segments 46 and conductive portions 56. In particular, the configurations of lateral portions 52 and 62 may allow current to be applied, and thus a magnetic field to be induced, farther away from the regions of the device laterally adjacent to magnetic junctions 22 than the distance between magnetic junctions 22 and conductive portions 38 and 56, respectively.

In addition, in some embodiments, conductive portions 38 and 56 may have a thickness less than the thickness of conductive segments 46. In particular, conductive portions 38 and 56 may have a thickness between approximately 25% and approximately 75% of the thickness of conductive segments 46. In general, the thickness of conductive segments 46 may be between approximately 4000 angstroms and approximately 8000 angstroms while the thickness of conductive portions 38 and 56 may be between approximately 1000 angstroms and approximately 5000 angstroms. Larger or smaller thicknesses of conductive segments 46 and conductive portions 38 and 56 may be appropriate, however, depending on the material used within such portions and the design characteristics of the device. In particular, it may be advantageous to fabricate conductive portions 38 and 56 at a relatively low thickness, such as approximately 1000 angstroms, since the strength of magnetic fields induced by a line is directly related to the thickness of the line. In particular, a relatively lower thickness will induce a relatively greater magnetic field due to the increase in current density in the line. Consequently, a relatively small thickness along a portion of the digit line adjacent to a magnetic junction may allow a higher magnetic field to be generated as compared to a magnetic field generated from a relatively thick portion of the digit line aligned with regions of the topography between two magnetic junctions. For example, in reference to FIGS. 2 and 3, lateral portions 50 and 60 may generate a higher magnetic field than lateral portions 52 and 62, respectively.

In some cases, second layers 36 and 54 may include a cladding layer arranged along the surface of the layer that is farthest from magnetic junctions 22. In particular, second layers 36 and 54 may include cladding layers 42 and 58 arranged along the bottom surfaces of conductive portions 38 and 56, respectively. As stated above, a "cladding layer", as used herein, may refer to a metal sheathe used to cover or line a portion of a metal structure. More specifically, a cladding layer may refer to a metal layer adapted to shield a magnetic field. In this manner, a cladding layer may be used to focus a generated magnetic field in a particular direction. For example, the magnetic field generated from conductive portions 38 and 56 may be directed toward magnetic junctions 22 in a more concentrated manner with the use of cladding layers 42 and 58. As a result, a higher magnetic field may be induced upon magnetic junctions 22 than in embodiments in which second layers 36 and 54 do not include such cladding layers. In some cases, lower currents may be used in devices which include cladding layers than devices that do not include cladding layers. Consequently, devices that include cladding layers may have lower overall power requirements than devices that do not include cladding layers. Materials for cladding layers 42 and 58 may include, for example, nickel-iron, cobalt-iron, or nickel-cobalt-iron. Other materials known for shielding magnetic fields may additionally or alternatively be used within cladding layers 42 and 58, depending on the design specifications of the device. Furthermore, the thickness of cladding layers 42 and 58 may be between approximately 10 angstroms and approximately 100 angstroms. However, other thicknesses of cladding layers 42 and 58 may be used, depending on the design characteristics of the device.

In some embodiments, second layer 36 and 54 may further include cladding layers arranged along the sidewalls on conductive portions 38 and 56, respectively. For example, second layer 54 may include cladding layer 58 arranged along the sidewalls of conductive portion 56. The arrangement of cladding layer 58 upon the sidewalls of conductive portion 56 is not depicted in FIG. 3 since the cross-sectional view is taken along the mid-section of the digit line (i.e., along line BB of FIG. 1). It is noted that upon taking a cross-sectional view of device 20 along line AA of FIG. 1 in an embodiment in which the digit line has a similar configuration to that of FIG. 3, cladding layer 58 along the sidewall portions of conductive portion 56 would be shown. Consequently, such a view would illustrate the portion of the digit line substantially aligned with one of magnetic junctions 22 to include cladding layer 58 arranged along two sidewalls of conductive portion 56.

The configuration of incorporating multiple conductive portions within the second layer of the digit line as shown in FIG. 2, however, may facilitate a portion of the digit line substantially aligned with one of magnetic junctions 22 to have a cladding layer arranged on all sidewalls of a portion of the second layer. In particular, second layer 36 may include cladding layer 42 arranged along four sidewalls of conductive portions 38. Such a configuration may advantageously focus an induced magnetic field in a more concentrated manner than in embodiments in which less than all of the sidewalls of a portion of the field-inducing line substantially aligned with one of the magnetic cell junctions are covered by a cladding layer. As a result, a lower current may be used in a device having a field-inducing line including multiple conductive portions within its second layer as compared to a field-inducing line having a single conductive portion within its second layer.

As stated above, digit lines 26 may be adapted to conduct current and, therefore, may be made of any conductive material, such as aluminum, copper, titanium, tungsten, or any alloy of such metals. In addition, the first and second layers of digit lines 26 may include the same or different materials. Consequently, in some embodiments, conductive segments 46 may include the same materials as conductive portions 38 and 56. In other embodiments, however, conductive segments 46 may include a different material than included in conductive portions 38 and 56. For example, in some embodiments, conductive segments 46 may include a material having a lower resistivity than conductive portions 38 and 56. For instance, conductive segments 46 may include aluminum and conductive portions 38 and 56 may include tungsten, in some embodiments. Other materials having relatively different levels of resistivity may be used for conductive segments 46 and conductive portions 38 and 56 as well, depending on the design characteristics of the device.

In general, using materials with different levels of resistivity may reduce the overall resistance of a field-inducing line. For example, using a material within conductive segments 46 of first layer 44 with lower resistivity than a material used in conductive portions 38 and 56 of second layers 36 and 54, respectively, may advantageously reduce the overall resistance of the digit lines of FIGS. 2 and 3. In particular, the resistance of a field-inducing line with such a composition of materials may be lower than a line consisting essentially of the higher resistive material. Such an embodiment may be particularly advantageous in an embodiment in which a particular material of relatively high resistance is desirable to have within a field-inducing line. For example, as described in more detail below in reference to FIG. 6, the use of materials, such as tungsten, that may be formed using the dual damascene technique may be desirable for second layers 36 and 54 such cladding layers may be formed therein.

Figure 6:
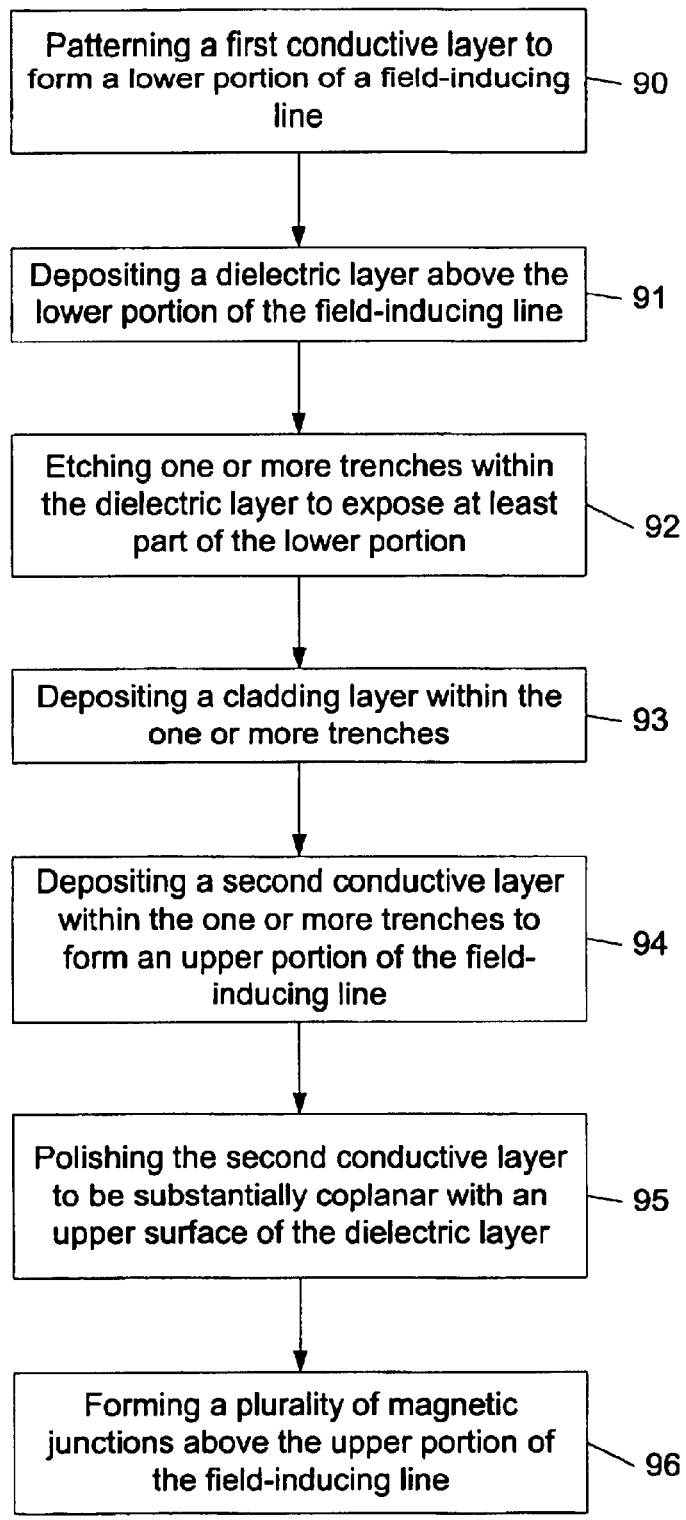
FIG. 6 depicts a flowchart of a method for making the digit line configurations shown in FIGS. 2 and 3.

A manner in which to fabricate the digit lines depicted in FIGS. 2 and 3 is illustrated in the flow chart shown in FIG. 6. In particular, FIG. 6 illustrates a method of patterning a first conductive layer to form a lower portion of a field-inducing line and depositing a second conductive layer upon and in contact with at least a part of the lower portion to form an upper portion of the field-inducing line. More specifically, the method may include patterning a first conductive layer to form the lower portion and forming a second conductive layer using a dual damascene technique to form the upper portion. As shown in FIG. 6, the method may include step 90 in which a first conductive layer is patterned to form a lower portion of a field-inducing line. In particular, step 90 may include patterning the first conductive layer into a plurality of separated conductive segments. Such a first conductive layer may include any conductive material, such as such as aluminum, copper, titanium, tungsten, or any alloy of such metals. In a preferred embodiment, the first conductive layer may include aluminum at a thickness between approximately 4000 angstroms and approximately 8000 angstroms. Other materials and/or thicknesses, however, may be used for the first conductive line, depending on the design characteristics of the device.

The method may continue to step 91 in which a dielectric layer is deposited above the lower portion of the field-inducing line. In some cases, the dielectric layer may be deposited such that an upper surface of the dielectric layer is above an upper surface of the conductive segments of the first conductive layer. Consequently, the dielectric layer may be deposited at a thickness between approximately 4000 angstroms and approximately a few microns. Larger or smaller thicknesses of the dielectric layer, however, may be deposited, depending on the design characteristics of the device. In some cases, the method may subsequently include polishing the dielectric layer such that a substantially planar surface may be obtained. In such an embodiment, forming such a substantially planar surface may include polishing the dielectric layer to a level above the conductive segments of the first conductive layer. In other cases, however, the method may not include such a polishing process. In any embodiment, the dielectric layer may include silicon dioxide, silicon nitride, silicon oxynitride, or any other dielectric material used in the semiconductor fabrication industry.

As shown in step 92, the method may include etching one or more trenches within the dielectric layer to expose at least part of the lower portion of the field-inducing line. In some cases, the method may include etching a single trench above the patterned lower portion of the field-inducing line. In such an embodiment, the etch process may include exposing the entirety of the plurality of patterned conductive segments of the first conductive layer. In other embodiments, however, the method may include etching a plurality of trenches spaced apart from each other and spanned above the plurality of separated conductive segments. In such an embodiment, each of the plurality of trenches may expose a portion of at least two of the patterned conductive segments of the first conductive layer. In any case, the etch process of step 92 may include any wet or dry etch techniques known in the semiconductor fabrication industry.

In some embodiments, the method may include depositing a cladding layer within the one or more trenches as indicated in step 93. In particular, the method may include depositing a cladding layer along the base and sidewalls of the trenches such that an upper surface of the cladding layer in the region of the trench does not extend above the portion of the dielectric layer arranged adjacent to the trenches. In this manner, the cladding layer may serve as a liner layer of an upper portion of the field-inducing line. Such a cladding layer may include nickel-iron, cobalt-iron, or nickel-cobalt-iron. In addition, such a cladding layer may be deposited at a thickness between approximately 10 angstroms and approximately 100 angstroms. Other materials and/or thicknesses, however, may be used, depending on the design specifications of the device. In yet other embodiments, a cladding layer may not be deposited within the trenches of the dielectric layer. In such an embodiment, the method may skip step 93 and continue to step 94.

Step 94 includes depositing a second conductive layer within the one or more trenches to form an upper portion of the field-inducing line. Such a deposition process may include any deposition technique known in the semiconductor fabrication industry. For example, the deposition process of step 94 may include, but is not limited to, chemical vapor deposition or physical vapor deposition techniques. In any case, the deposition process may include filling the trenches such that an upper surface of the second conductive layer is above the trench. Consequently, the deposition process may include depositing the second conductive layer at a thickness between approximately 25 angstroms and approximately 400 angstroms. Larger or smaller thicknesses of the second conductive layer may be deposited, however, depending on the design specifications of the device.

In addition, the method may include polishing the second conductive layer as shown in step 95. In particular, the method may include polishing the second conductive layer such that an upper surface of the second conductive layer is substantially coplanar with an upper surface of the dielectric layer. In this manner, the formation of the upper portion of the field-inducing line may be formed by the "dual damascene" technique. More specifically, the formation of the upper portion of the field-inducing line may be formed by etching a trench, filling the trench with a conductive layer, and polishing the layer to be coplanar with adjacent regions of the topography. Consequently, a fill layer that is adaptable to a dual damascene technique, such as tungsten, may be used to form an upper portion of the field-inducing line. In an embodiment in which a cladding layer is deposited within the trenches prior to the deposition of the second conductive layer, the polishing process may further include removing portions of the cladding layer deposited upon the dielectric layer formed adjacent to the trenches. In any case, the method may further include forming a plurality of magnetic junctions above the upper portion of the field inducing line as shown in step 96. Consequently, a device having a cross-sectional profile similar to the topographies shown in FIGS. 2 and 3 may be formed.

Although the configurations described in reference to FIGS. 2 and 3 are illustrated for digit lines 26, similar configurations may be additionally or alternatively used for bit lines 24. Exemplary embodiments illustrating such configurations are shown in FIGS. 4 and 5. As stated above, FIGS. 4 and 5 illustrate partial cross-sectional profiles of device 20 taken along line AA of FIG. 1. FIG. 4, in particular, illustrates a partial cross-sectional profile of device 20 with one of bit lines 24 having first layer 64 including a plurality of conductive segments 66 spaced from each other by dielectric portions 68. FIG. 4 further illustrates the bit line having second layer 70 having a plurality of conductive portions 72 spaced from each other by dielectric portions 74. Preferably, conductive portions 72 span across and below dielectric portions 68 such that they may be in contact with at least two of conductive segments 66. FIG. 5 illustrates yet another embodiment in which one of bit lines 26 includes second layer 78 having conductive portion 80 arranged across and in contact with all of the dielectric spaced conductive segments of first layer 64.

In either embodiment, the second layer may include a cladding layer arranged along the upper surface and sidewalls of the conductive portions of the second layer. In particular, second layer 70 may include cladding layer 76 arranged upon the upper surface and sidewalls of conductive portions 72. Similarly, second layer 78 may include cladding layer 82 arranged upon the upper surface of sidewalls of conductive portion 80. In both cases, the cladding layer is arranged upon the surface of the second layer that is farthest from the magnetic cell junction. In this manner, the cladding layers may serve to shield the magnetic field induced by conductive portions 72 and 80. Consequently, the magnetic fields generated from the second layer of the bit lines of FIGS. 4 and 5 may be directed toward magnetic junctions 22 at a higher magnitude than a device which includes a bit line with a conventional configuration (i.e., a single conductive layer having one pattern configuration). As a result, the magnetic direction of magnetic junctions 22 may be switched with a lower current than the magnetic direction of magnetic junctions used in conventional devices.

In addition, the field-inducing lines illustrated in FIGS. 4 and 5 may be described in reference to their lateral portions. More specifically, bit lines 24 and digit lines 26 illustrated in FIGS. 4 and 5 may be described in reference to their lateral position relative to the position of magnetic junctions 22. For example, the bit lines shown in FIG. 4 may have lateral portion 84 substantially aligned with one of magnetic cell junctions 22 and lateral portion 86 substantially aligned with regions of device 20 arranged between two of magnetic junctions 22. Referring to FIG. 5, the bit line may include lateral portion 88 arranged in alignment with one of magnetic junctions 22 and lateral portion 89 substantially aligned with regions of device 20 arranged between two of magnetic junctions 22. As shown in FIG. 5, the surfaces of lateral portions 84 and 88, which are farthest from magnetic junction 22, may include cladding layer 76 and 82. On the other hand, the surfaces of lateral portions 86 and 89 farthest from the region of device 20 between magnetic cell junctions 22 may be absent of a cladding layer.

It will be appreciated to those skilled in the art having the benefit of this disclosure that this invention is believed to provide a field-inducing line configuration for MRAM applications. Further modifications and alternative embodiments of various aspects of the invention will be apparent to those skilled in the art in view of this description. For example, such configurations of a field-inducing line may be used for any application in which magnetic fields are used for an operation of a device. It is intended that the following claims be interpreted to embrace all such modifications and changes and, accordingly, the drawings and the specification are to be regarded in an illustrative rather than a restrictive sense.

What is claimed is:

1. A semiconductor topography, comprising:
   a magnetic cell junction; and
   a field-inducing line adapted to induce a magnetic field about the magnetic cell junction, wherein the field-inducing line comprises:
   a first layer comprising a plurality of dielectrically spaced conductive segments; and a second layer comprising a conductive portion in contact with at least two of the plurality of the dielectrically spaced conductive segments of the first layer, wherein the second layer is arranged vertically closer to the magnetic cell junction than the first layer is arranged to the magnetic cell junction.

2. The semiconductor topography of claim 1, wherein the conductive portion of the second layer spans across and in contact with all of the dielectrically spaced conductive segments of the first layer.

3. The semiconductor topography of claim 1, wherein the conductive portion of the second layer is one of a plurality of dielectrically spaced conductive portions arranged in contact with the plurality of the dielectrically spaced conductive segments of the first layer.

4. The semiconductor topography of claim 1, wherein the conductive portion of the second layer comprises a cladding layer outlining the sidewalls of the conductive portion and the surface of the conductive portion farthest from the magnetic cell junction.

5. The semiconductor topography of claim 1, wherein at least one of the plurality of conductive segments of the first layer comprises aluminum.

6. The semiconductor topography of claim 1, wherein the conductive portion of the second layer comprises tungsten.

7. The semiconductor topography of claim 1, wherein the magnetic cell junction is arranged vertically adjacent to the conductive portion of the second layer.

8. The semiconductor topography of claim 1, wherein at least one of the plurality of conductive segments of the first layer is thicker than the conductive portion of the second layer.

9. A semiconductor topography, comprising:
a plurality of magnetic memory elements; and
a field-inducing line adapted to induce a magnetic field about the plurality of magnetic memory elements, wherein the field-inducing line comprises a first set of dielectrically spaced conductive segments substantially aligned with spacings between the plurality of magnetic memory elements.

10. The semiconductor topography of claim 9, wherein the field-inducing line further comprises a contiguous conductive line arranged vertically adjacent to the first set of dielectrically spaced conductive segments.

11. The semiconductor topography of claim 9, wherein the field-inducing line further comprises a second set of dielectrically spaced conductive segments substantially aligned with the plurality of magnetic memory elements.

12. The semiconductor topography of claim 9, wherein the first set of dielectrically spaced conductive segments laterally overlap the second set of dielectrically spaced conductive segments by an amount between approximately 0.1 micron and approximately 1.0 micron.

13. The semiconductor topography of claim 9, wherein the field-inducing line is arranged above the plurality of magnetic memory elements.

14. The semiconductor topography of claim 9, wherein the field-inducing line is arranged below the plurality of magnetic memory elements.

15. The semiconductor topography of claim 9, wherein the field-inducing line is adapted to induce a higher magnetic field along the magnetic junctions than along spaces between the magnetic junctions.

16. A semiconductor topography, comprising:
a magnetic cell junction; and
a field-inducing line adapted to induce a magnetic field about the magnetic cell junction, wherein the field-inducing line comprises a cladding layer interposed between remote and distant portions of the field-inducing line relative to the magnetic cell junction.

17. The semiconductor topography of claim 16, wherein the remote portions of the field-inducing line comprise a plurality of dielectrically spaced conductive segments, and wherein the cladding layer is further arranged along more than two sidewalls of at least one of the dielectrically spaced conductive segments.

18. The semiconductor topography of claim 16, wherein the remote portions of the field-inducing line comprise a contiguous conductive line, and wherein the cladding layer is arranged along sidewalls of the contiguous conductive line.

19. The semiconductor topography of claim 16, wherein the magnetic cell junction is one of a plurality of magnetic cell junctions aligned with the field-inducing line, and wherein the distant portions of the field-inducing line comprise a plurality of dielectrically spaced conductive segments substantially aligned with spacings between the plurality of magnetic cell junctions.

20. The semiconductor topography of claim 16, wherein the remote and distant portions of the field-inducing line comprise materials of different resistivities.

* * * * *

UNITED STATES PATENT AND TRADEMARK OFFICE
CERTIFICATE OF CORRECTION

PATENT NO. : 6,822,278 B1
DATED : November 23, 2004
INVENTOR(S) : Koutny

It is certified that error appears in the above-identified patent and that said Letters Patent is hereby corrected as shown below:

Title page,
Item [54], Title, please delete "FIELD-INDUCDING" and substitute therefor
-- FIELD-INDUCING --.
Item [74], *Attorney, Agent or Firm*, after "Mollie E. Lettang" please insert -- ; Conley Rose P.C. --

Signed and Sealed this

Tenth Day of May, 2005

JON W. DUDAS
*Director of the United States Patent and Trademark Office*